United States Patent
Wu et al.

(10) Patent No.: US 6,462,593 B2
(45) Date of Patent: *Oct. 8, 2002

(54) COMPENSATION CIRCUIT FOR LOW PHASE OFFSET FOR PHASE-LOCKED LOOPS

(75) Inventors: Chung-Hsiao R. Wu, Sunnyvale, CA (US); Drew G. Doblar, San Jose, CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 14 days.

(21) Appl. No.: 09/359,952

(22) Filed: Jul. 22, 1999

(65) Prior Publication Data

US 2001/0013800 A1 Aug. 16, 2001

(51) Int. Cl.[7] .................................................. H03L 7/06
(52) U.S. Cl. ........................ 327/156; 147/362; 147/159; 147/7; 331/1 A
(58) Field of Search ............................ 327/7, 362, 156, 327/147, 159; 331/1 A, 17

(56) References Cited

U.S. PATENT DOCUMENTS

| | | | |
|---|---|---|---|
| 3,725,793 A | 4/1973 | Phillips | 327/161 |
| 4,599,570 A | 7/1986 | Cloke | 331/1 A |
| 4,929,854 A | 5/1990 | Iino et al. | 327/297 |
| 4,970,405 A | 11/1990 | Hagiwara | 327/145 |
| 4,989,175 A | 1/1991 | Boris et al. | 713/401 |
| 5,058,132 A | 10/1991 | Li | 375/260 |
| 5,256,994 A | 10/1993 | Langendorf | 331/1 A |
| 5,307,381 A | 4/1994 | Ahuja | 327/156 |
| 5,386,437 A * | 1/1995 | Yasuda | 327/159 |
| 5,663,685 A * | 9/1997 | Kesner | 331/1 A |
| 6,154,089 A * | 11/2000 | Rombach | 327/538 |

FOREIGN PATENT DOCUMENTS

| | | |
|---|---|---|
| DE | 3218363 | 11/1983 |
| DE | WO9820614 | 5/1998 |

* cited by examiner

*Primary Examiner*—Dinh T. Le
(74) *Attorney, Agent, or Firm*—Conley, Rose & Tayon, PC; B. Noël Kivlin

(57) ABSTRACT

A phase-locked loop circuit and method for providing for compensation for an offset. A phase-locked loop circuit comprises a phase detector, a compensation circuit, a loop filter, and a VCO. The phase detector is coupled to receive a first input signal and a second input signal. The phase detector is configured to output one or more of a plurality of output signals indicative of a difference between the first input signal and the second input signal. The compensation circuit is coupled to receive the output signals and to reduce a voltage offset between the output signals. The compensation circuit is further configured to provide a plurality of compensated output signals. The loop filter is coupled to receive the compensated control signals. The loop filter is configured to output a first control signal. The VCO is coupled to receive the first control signal and to output the second input signal based on the first control signal. A method of operating a phase-locked loop circuit comprises receiving and comparing a first input signal and a second input signal and providing output signals indicative of the comparison. The method compensates for a voltage offset between the output signals and provides compensated output signals indicative of the compensation. The method filters the compensated control signals and provides a control signal indicative of the filtration. The method provides the second input signal based on the first control signal. Lower skew between the input and output may be achieved.

12 Claims, 5 Drawing Sheets

COMPENSATION CIRCUIT FOR LOW PHASE OFFSET FOR PHASE-LOCKED LOOPS

FIELD OF THE INVENTION

This invention relates to electronic circuits, and, more particularly, to compensation circuits for phase-locked loops.

DESCRIPTION OF THE RELATED ART

The need to generate a local signal that is synchronized with an external reference signal is critical in many electronics applications such as frequency synthesis, clock recovery, clock generation and frequency demodulation. This coherence between the reference signal and the local replica is referred to as "phase synchronization". This typically implies either that local signal either is in phase with the external reference signal or is offset from the reference signal by some phase constant.

At the heart of any such synchronization circuit is some form of a phase-locked loop circuit (PLL). Phase-locked loops are feedback control loops, whose controlled parameter is the phase of a locally generated replica of an incoming reference signal. Phase-locked loops have three basic components: a phase detector, a loop filter, and a voltage-controlled oscillator.

FIG. 1—Basic PLL

A basic schematic diagram of a typical PLL 100 is presented in FIG. 1. As shown, PLL 100 is configured to generate an output signal 126 in response to an input signal 110. PLL 100 includes a phase detector 115, a loop filter 120, and a voltage-controlled oscillator (VCO) 125. Phase detector 115 is coupled to receive input clock signal 110 and to produce output clock signal 126. Phase detector 115 measures the phase difference between signals 110 and 126 (coupled here back to the phase detector 115 as feedback signal 127), and generates a phase error signal 116, which may be a voltage indicative of this phase difference. It is noted that the phase detector 115 illustrated in FIG. 1 outputs a phase error signal 116 including an UP signal and a DN signal. The UP signal may be interpreted as indicating that the output signal 126 should be higher in frequency to match the input signal 110. The DN signal may be interpreted as indicating that the output signal 126 should be lower in frequency to match the input signal 110. In other embodiments, the phase error signal 116 may consist of a single signal or include more than two signals.

In some instances, phase detector 115 may also generate a phase error signal 116 even when there is no difference between signals 110 and 127. For example, the phase detector 115 may output a small UP signal and a large DN signal, thereby providing both an UP signal and a DN signal to the filter 120 when only a DN signal may have been an appropriate signal of the phase error. As signals 110 and 127 change with respect to each other, signal 116 becomes a time-varying signal into loop filter 120. This phase comparison is necessary to prevent output signal 126 from drifting with respect to reference signal 110. As shown, the feedback signal 127 is an internal part of the PLL 100. It is noted that the feedback signal 127 may be a signal external to the PLL 100.

Loop filter 120 governs the response of PLL 100 to the error detected between signals 110 and 127. A well-designed loop filter 116 should be able to track changes in the phase of the input signal 110 but should not be overly responsive to noise mixed with the input signal 110. Loop filter 120 generates an error correction signal 121, which is the input to VCO 125. In one embodiment, a zero voltage on signal 121 causes the output of VCO 125, output signal 126, to oscillate at a predefined frequency, $\omega_0$, which is the "center" frequency of the oscillator. On the other hand, a positive voltage on error correction signal 121 causes output signal 126 to oscillate at a frequency which is greater than $\omega_0$. Conversely, a negative voltage on error correction signal 121 causes output signal 126 to oscillate at a frequency less than $\omega_0$.

In another embodiment, either only a positive voltage or only a negative voltage on error correction signal 121 is generated. In various embodiments, even when there is no difference between signals 110 and 127, an error correction signal 121 is output. In still another embodiment, the error correction signal 121 is scaled such that although the error correction signal 121 is always of one sign, such as always positive, the error correction signal 121 corrects for oscillation either above or below the predefined frequency.

Generally speaking, in many embodiments, the output frequency of VCO 125 is a linear function of its input voltage over some range of input and output. "Phase lock" is achieved by feeding the output of VCO 125 back to phase detector 115 so that continual error correction may be performed. It is noted that PLL 100 may not achieve phase lock if input signal 110 is outside of some predetermined range.

In a simplest form, loop filter 120 is simply a conductor that receives a single phase error signal 116 from the phase detector 115. In this simplest embodiment, the phase error 116 is equal to error correction signal 121. Such a filter 120 allows PLL 100 to generate an output signal 126 which matches reference signal 110 in frequency and phase only if reference signal 110 is equal to the center frequency of VCO 125. If reference signal 110 oscillates at a different frequency from the center frequency of VCO 125, output signal 126 may match reference signal 110 in frequency but not phase. This "wire filter" is an example of a first-order PLL, which means that the denominator of the loop filter transfer function has no exponent value greater than one. In another embodiment of a first-order PLL, loop filter 120 includes an amplifier.

It is noted that PLL 100 may be fabricated on a monolithic substrate or produced from discrete components. The components 115, 120, and 125 used to create the PLL 100 may not be matched in electrical properties to each other, leading to instability of the PLL 100. What is needed is a way to provide for an improved PLL circuit with greater stability.

SUMMARY OF THE INVENTION

The problems outlined above are in large part solved by a phase-locked loop circuit and method for providing for compensation for voltage offset. In one embodiment, a voltage offset between output signals of a phase detector may be reduced by a compensation circuit. The compensation circuit may advantageously allow for greater stability for the PLL, especially when the PLL is produced using discrete components.

A phase-locked loop circuit is contemplated comprising, in one embodiment, a phase detector, a compensation circuit, a loop filter, and a VCO. The phase detector is coupled to receive a first input signal and a second input signal. The phase detector is configured to output one or more of a plurality of output signals indicative of a difference between the first input signal and the second input signal. The compensation circuit is coupled to receive the output signals and to reduce a voltage offset between the output signals. The compensation circuit is further configured to provide a plurality of compensated output signals. The loop filter is coupled to receive the compensated control signals. The loop filter is configured to output a first control signal. The VCO is coupled to receive the first control signal and to output the second input signal based on the first control signal.

A method of operating a phase-locked loop circuit is also contemplated. In one embodiment, the method comprises receiving a first input signal and a second input signal. The method compares the first input signal and the second input signal and provides a plurality of output signals indicative of a result of comparing the first input signal and the second input signal. The method compensates for a voltage offset between the plurality of output signals to reduce the voltage offset. The method provides a plurality of compensated output signals indicative of the result of the compensating. The method filters the plurality of compensated control signals and provides a first control signal indicative of the result of the filtering. The method provides the second input signal based on the first control signal.

In various embodiments, the VCO may be a voltage controlled crystal oscillator (VCXO), and the loop filter may be configured as an integrator and/or as an active filter. In one embodiment, the compensation circuit includes a pair of common-base transistors. The first transistor includes a base biased by a base voltage, an emitter coupled to receive a first one of the output signals, and a collector coupled to provide a first one of the compensated control signals. The second transistor includes a base biased by the base voltage, an emitter coupled to receive a second one of the output signals, and a collector coupled to provide a second one of the compensated control signals. In one embodiment, the transistors are NPN transistors. In another embodiment, the transistors are PNP transistors.

BRIEF DESCRIPTION OF THE DRAWINGS

Other objects and advantages of the invention will become apparent upon reading the following detailed description and upon reference to the accompanying drawings in which.

Figure 1:
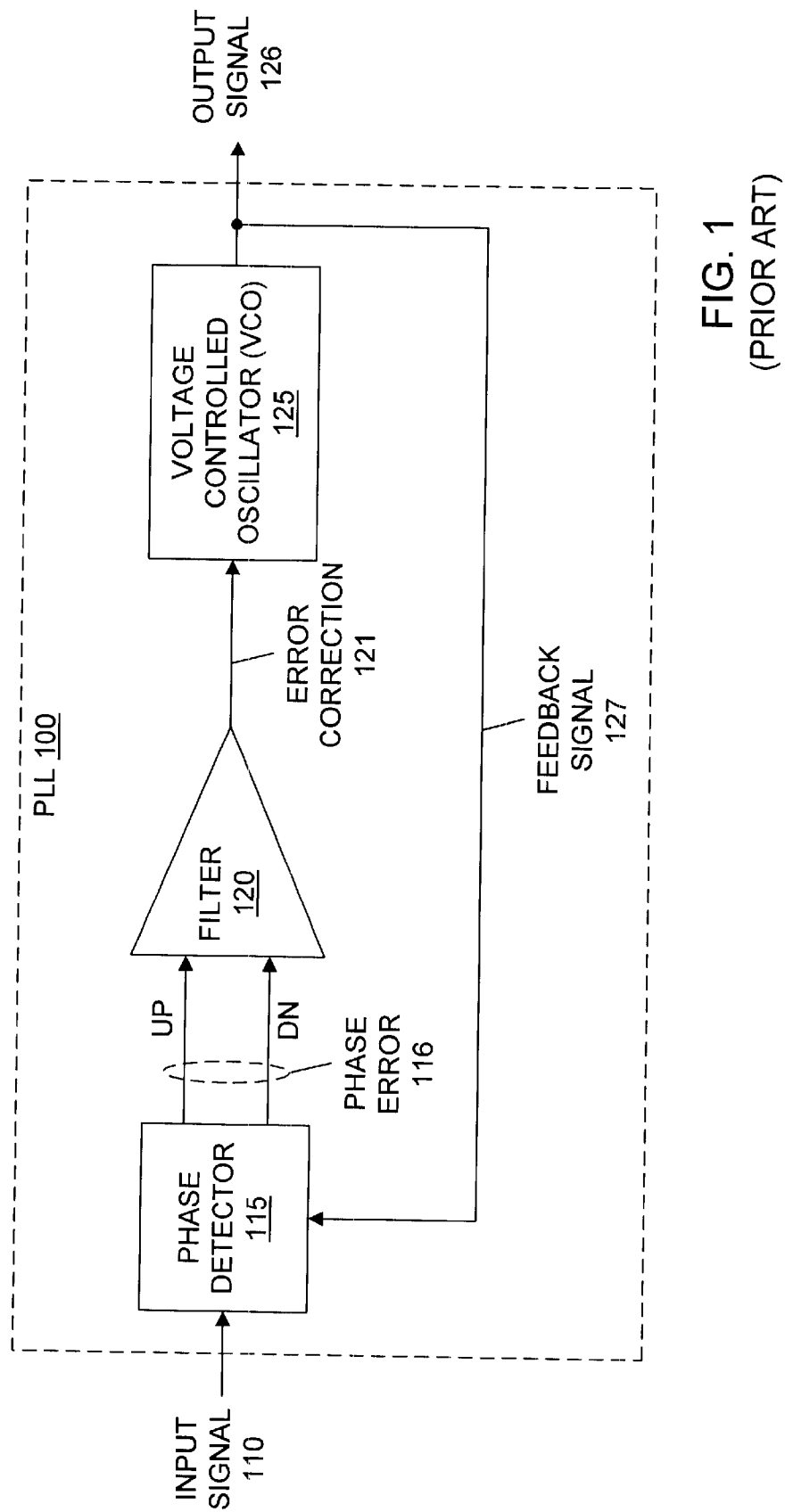
FIG. 1 is a block diagram of an embodiment of a prior art PLL circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
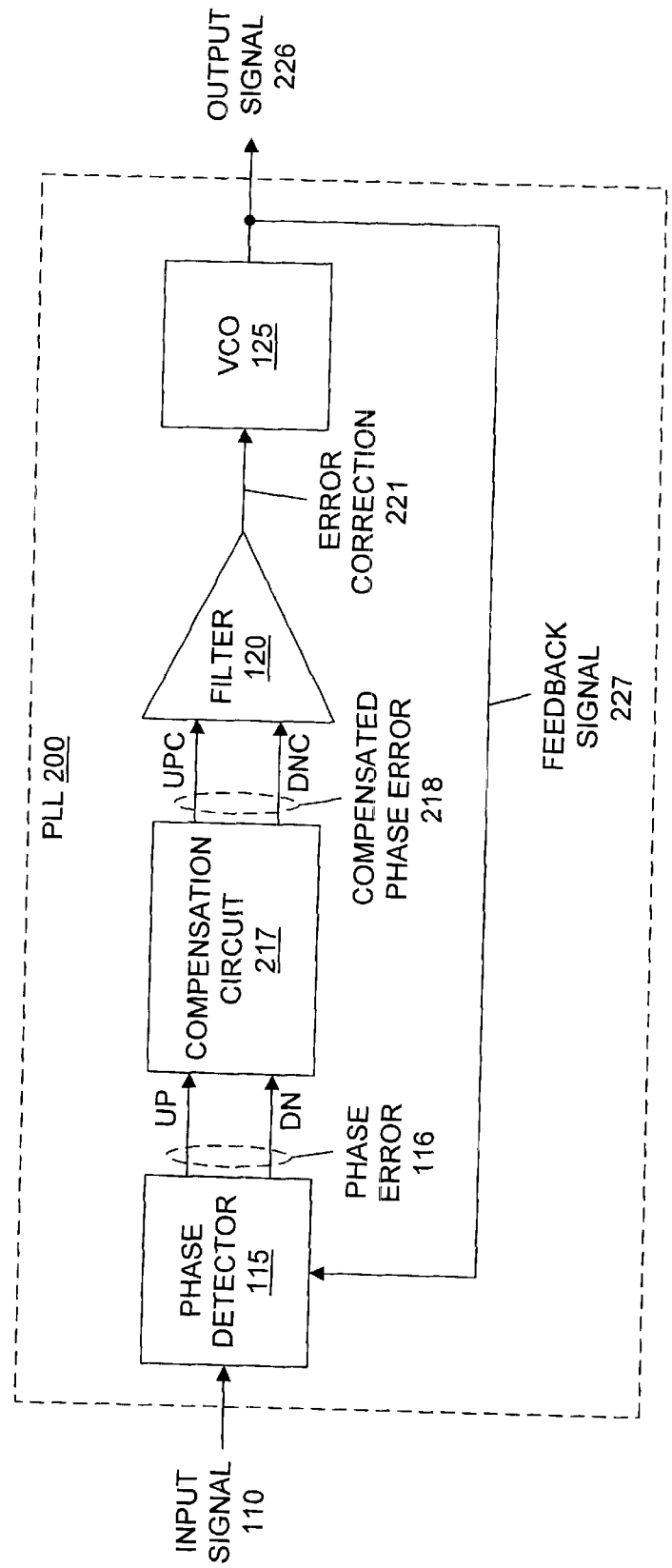
FIG. 2 is a block diagram of an embodiment of a generic PLL circuit including compensation circuit.

FIG. 2—Generic PLL Circuit with Compensation

As shown, PLL 200 is configured to generate an output signal 226 in response to an input signal 110. PLL 200 includes a phase detector 115, a compensation circuit 217, a loop filter 120, and a voltage-controlled oscillator (VCO) 125. PLL 200 is coupled to receive input clock signal 110 and to produce output clock signal 126.

Phase detector 115 measures the phase difference between signals 110 and 226 (coupled here back to the phase detector 115 as feedback signal 227), and generates a phase error signal 116, which may be a voltage indicative of this phase difference. As shown, phase detector 115 outputs an UP signal (UP) and a DOWN signal (DN) in response to a difference between the input signal 110 and the feedback signal 227. In some embodiments, phase detector 115 may also generate an UP signal and/or a DN signal even when there is no difference between signals 110 and 227. As signals 110 and 227 change with respect to each other, signal 116 becomes a time-varying signal into compensation circuit 217. This phase comparison is necessary to prevent output signal 226 from drifting with respect to reference signal 110. This phase comparison is necessary to prevent output signal 226 from drifting with respect to reference signal 110. As shown, the feedback signal 227 is an internal part of the PLL 200. It is noted that the feedback signal 227 may be a signal external to the PLL 200.

Compensation circuit 217 is designed to compensate for an offset between the UP signal and the DN signal of the phase error signal 116. The compensation circuit 217 is configured to output a compensated phase error signal 218 to the loop filter 120. In one embodiment, the compensation circuit 217 is configured to compensate for a voltage offset between the baseline voltages of the UP and the DN signals. In another embodiment, the compensation circuit 217 is configured to compensate for a voltage offset between upper level voltages of the UP and the DN signals. As used herein, "compensation" may refer to a reduction or removal of a non-uniformity, such as a phase offset, voltage offset, or skew. By way of example, without compensation, a voltage offset between the UP and DN pulses are integrated by the loop filter 120, leading directly to greater phase skew between input signal 110 and output signal 226/feedback signal 227.

It is noted that other embodiments are also contemplated. For example, the phase detector 115 may output a short DN signal along with a long UP signal. Rather than having the filter handle both UP and DN signals, the compensation circuit 217 may subtract the DN signal from the UP signal before providing the compensated UP signal to the filter 120 as the compensated phase error signal 218. Other embodiments may compensate for phase error or skew, among other variables.

Loop filter 120 governs the response of PLL 100 to the error detected between signals 110 and 127. The loop filter 120 may be any order filter as desired. The loop filter 120 outputs an error correction signal 221 to the VCO 125. In one embodiment, the error correction signal 221 is a control voltage. Other error correction signals 221 may be used as desired.

Generally speaking, in various embodiments, the output frequency of VCO 125 is a linear function of its input voltage over some range of input and output. "Phase lock" is achieved by feeding the output of VCO 125 (as feedback signal 227) back to phase detector 115 so that continual error correction may be performed. It is noted that PLL 200 may not achieve phase lock if input signal 110 is outside of some predetermined range.

Figure 3:
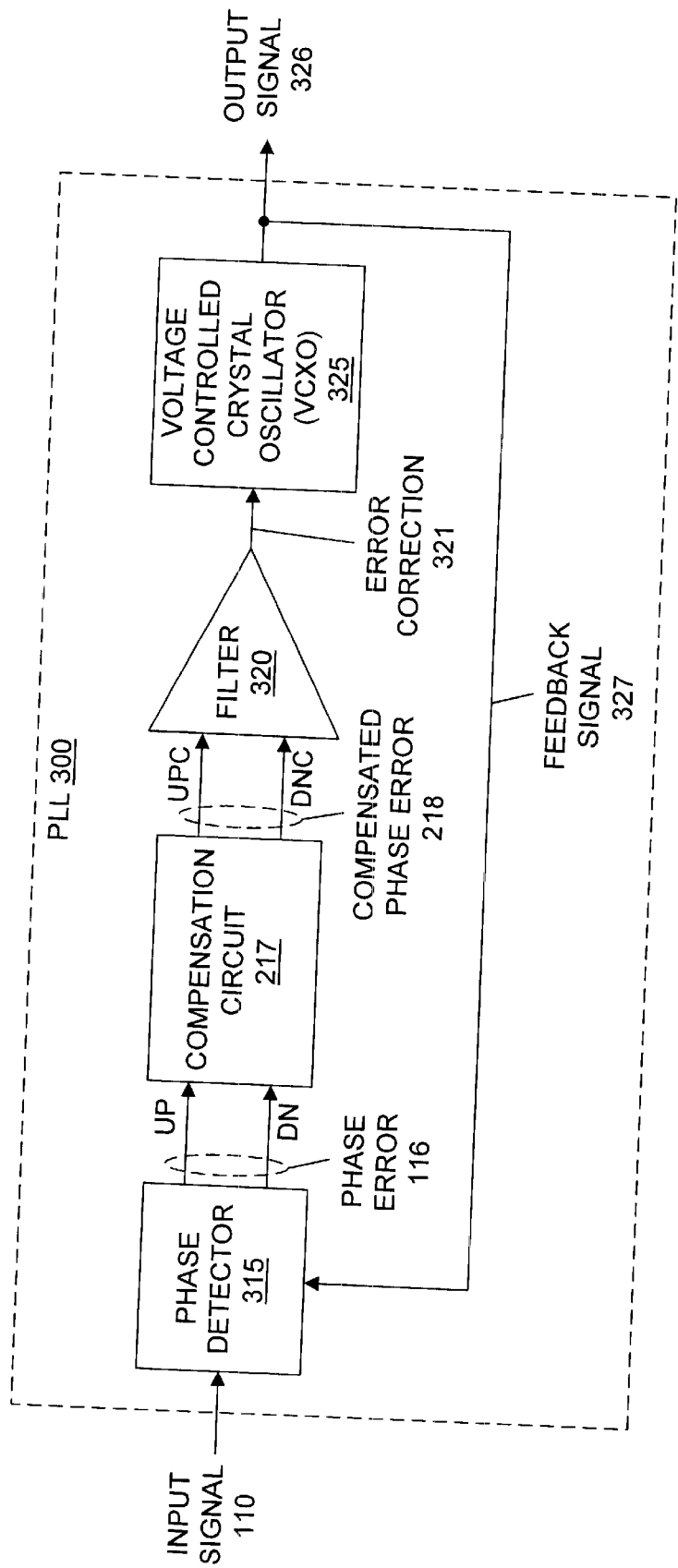
FIG. 3 is a block diagram of a further embodiment of a PLL circuit including a compensation circuit.

FIG. 3—PLL Circuit with Compensation

As shown, PLL 300 is configured to generate an output signal 326 in response to an input signal 110. PLL 300 includes a phase detector 315, a compensation circuit 217, an active integrating low-pass filter 320, and a voltage-controlled crystal oscillator (VCXO) 325. PLL 300 is coupled to receive input signal 110 and to produce output signal 326.

Phase detector 115 measures the phase difference between signals 110 and 326 (coupled here back to the phase detector 115 as feedback signal 327), and generates a phase error signal 116, which may be a voltage indicative of this phase difference. As shown, phase detector 115 outputs an UP signal and a DN signal in response to a difference between the input signal 110 and the feedback signal 327. In this embodiment, phase detector 115 normally generates a minimum duration UP signal and a minimum duration DN signal even when there is no difference between signals 110 and 327. As signals 110 and 327 change with respect to each other, signal 116 becomes a timevarying signal into compensation circuit 217. This phase comparison is necessary to prevent output signal 326 from drifting with respect to reference signal 110. This phase comparison is necessary to prevent output signal 226 from drifting with respect to reference signal 110. As shown, the feedback signal 227 is an internal part of the PLL 200. It is noted that the feedback signal 227 may be a signal external to the PLL 200.

Compensation circuit 217 is configured to compensate for a voltage offset between the UP signal and the DN signal of the phase error signal 116. The compensation circuit 217 is also configured to output a compensated phase error signal 218, as UPC and DNC, to the filter 320.

Filter 320 governs the response of PLL 300 to the error detected between signals 110 and 327. The filter 320 preferably comprises a unity-amplifying operational amplifier configured as an integrator. The loop filter 320 outputs an integrated error correction signal 321 to the VCXO 125.

In the illustrated embodiment, the output frequency of VCXO 325 is a linear function of its input voltage over a limited range of input and output frequency. "Phase lock" is achieved by feeding the output of VCO 325 (as feedback signal 327) back to phase detector 115 so that continual error correction may be performed. It is noted that PLL 300 may not achieve phase lock if input signal 110 is outside of some predetermined operating range.

Figure 4A:
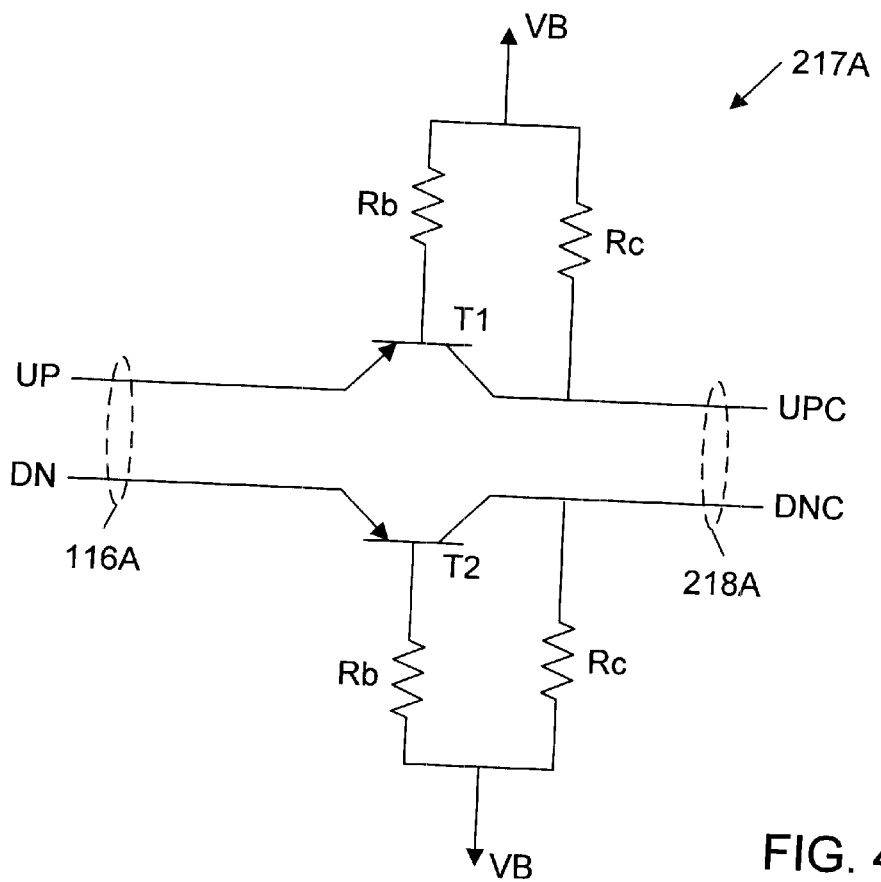
FIGS. 4A and 4B are circuit diagrams of embodiments of the compensation circuit.

FIGS. 4A/4B—DCBT Compensation Circuit Embodiments

Turning now to FIG. 4A, one embodiment of compensation circuit 217 is shown as a dual common-base transistor circuit 217A. Two symmetrical common-base PNP transistors T1 and T2 operate as high speed switches with a threshold voltage set by bias voltage VB, through resistors Rc. The transistors T1 and T2 accept the phase error signal 116A and output the compensated phase error signal 218A.

When UP and DN are idle at a baseline voltage, the voltage between the emitter and the base is less than the turn-on voltage, through resistors Rb, so the PNP transistors T1 and T2 are turned off. Both UPC and DNC are pulled to VB when the PNP transistors T1 and T2 are turned off, providing for a voltage offset of zero when the UPC and DNC outputs are at a baseline idle state.

When UP and DN are active, the UP and DN signals turn on the PNP transistors T1 and T2 as the voltage of the UP and DN pulses is enough to exceed the emitter-base turn-on voltage. In the illustrated embodiment, any voltage offset of the UP and DN signals at the active voltage is negligible as the integration time for the active state is much smaller than the integration time for the idle state.

Figure 4B:
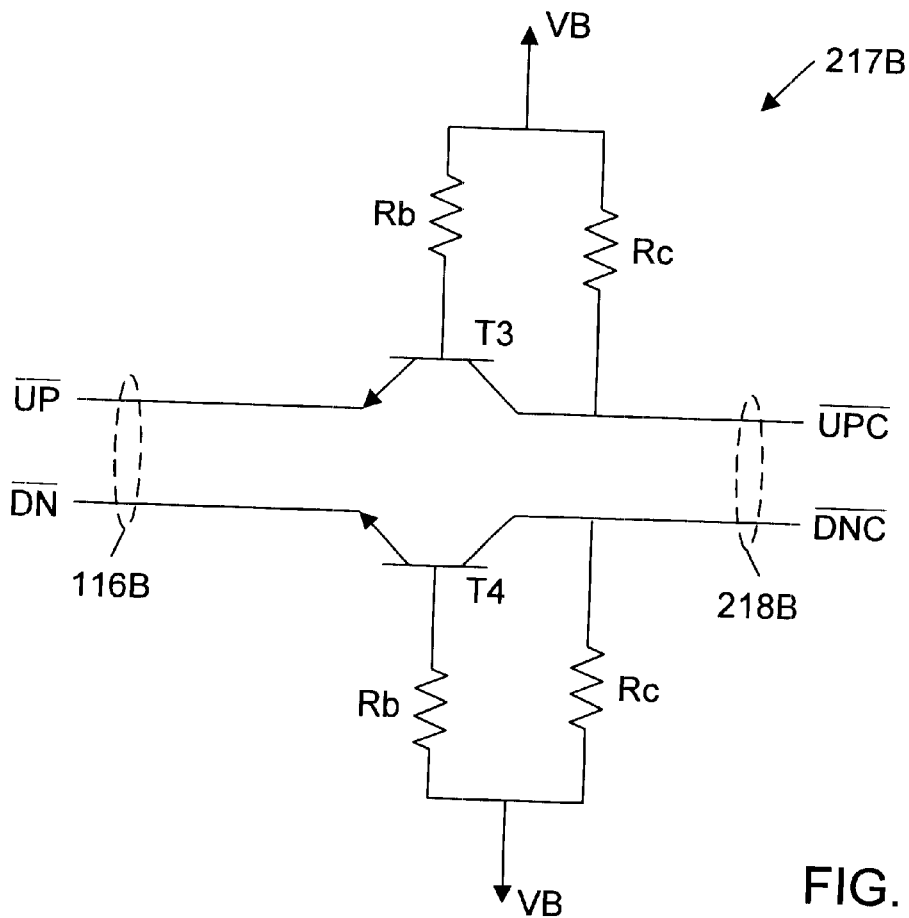

Turning now to FIG. 4B, another embodiment of the compensation circuit 217 is shown as a dual common-base transistor circuit 217B. Two symmetrical common-base NPN transistors T3 and T4 operate as high speed switches with a threshold voltage set by bias voltage VB, through resistors Rc. The transistors T3 and T4 accept the phase error signal 116B and output the compensated phase error signal 218B.

When UP# and DN# are idle at a baseline voltage, the voltage between the emitter and the base is less than the turn-on voltage, through resistors Rb, so the NPN transistors T3 and T4 are turned off. Both UPC# and DNC# are pulled to VB when the NPN transistors T3 and T4 are turned off, providing for a voltage offset of zero when the UPC# and DNC# outputs are at a baseline idle state.

When UP# and DN# are active, the UP# and DN# signals turn on the NPN transistors T3 and T4 as the voltage of the UP# and DN# pulses is enough to exceed the emitter-base turn-on voltage. In the illustrated embodiment, any voltage offset of the UP# and DN# signals at the active voltage is negligible as the integration time for the active state is much smaller than the integration time for the idle state. It is noted that when using the compensation circuit 217B, the UPC# and DNC# signals must be cross connected to the filter 320 inputs.

For the purposes of this disclosure, all clocking signals are preferably low voltage pseudo-ECL signals (LVPECL). Other types of clocking signals may be used as desired. Numerous variations and modifications will become apparent to those skilled in the art once the above disclosure is fully appreciated. It is intended that the following claims be interpreted to embrace all such variations and modifications.

What is claimed is:

1. A phase-locked loop circuit, comprising:
   a phase detector coupled to receive a first input signal and a second input signal, wherein said phase detector is configured to output a plurality of output signals indicative of a difference between said first input signal and said second input signal;
   a compensation circuit coupled to receive said plurality of output signals, wherein said compensation circuit is configured to reduce an offset between said plurality of output signals to provide a plurality of compensated output signals, wherein the compensation circuit includes:
      a first transistor having a first base biased by a base voltage, a first emitter coupled to receive a first signal of said plurality of output signals, and a first collector coupled to provide a first compensated output signal of said plurality of compensated output signals; and
      a second transistor having a second base biased by said base voltage, a second emitter coupled to receive a second signal of said plurality of output signals, and a second collector coupled to provide a second compensated output signal of plurality of compensated output signals;
      wherein the first compensated output signal and the second compensated output signal are produced independently of one another without combining the plurality of output signals;
   a loop filter coupled to receive said plurality of compensated output signals, wherein said loop filter is configured to output a control signal; and
   a voltage controlled oscillator (VCO) coupled to receive said control signal, wherein said VCO is configured to output said second input signal based on said control signal.

2. The phase-locked loop circuit of claim 1, wherein said VCO is a voltage controlled crystal oscillator (VCXO).

3. The phase-locked loop circuit of claim 1, wherein said loop filter is configured as an integrator.

4. The phase-locked loop circuit of claim 1, wherein said loop filter is configured as an active filter.

5. The phase-locked loop circuit of claim 1, wherein said first transistor and said second transistor are NPN transistors.

6. The phase-locked loop circuit of claim 1, wherein said first transistor and said second transistor are PNP transistors.

7. The phase-locked loop circuit of claim 1, wherein a difference between said base voltage and an idle voltage level for said first signal of said plurality of output signals is less than a turn-on voltage of said first transistor, and wherein said difference between said base voltage and said idle voltage level for said second signal of said plurality of output signals is less than said turn-on voltage of said second transistor.

8. The phase-locked loop circuit of claim 7, wherein said difference between said base voltage and an active voltage level for said first signal of said plurality of output signals is greater than or equal to said turn-on voltage of said first transistor, and wherein said difference between said base voltage and said active voltage level for said second signal of said plurality of output signals is greater than or equal to said turn-on voltage of said second transistor.

9. The phase-locked loop circuit of claim 1, wherein said compensation, circuit includes one or more switches coupled to receive said plurality of output signals, wherein said one or more switches are configured to output compensated output signals in response to receiving said plurality of output signals, wherein said compensated output signals have approximately no offset.

10. The phase-locked loop circuit of claim 1, wherein one or more of the phase detector, the loop filter, or the VCO are comprised of discrete components.

11. A method of operating a phase-locked loop circuit, the method comprising:

receiving a first input signal and a second input signal;

comparing said first input signal and said second input signal;

providing a plurality of output signals indicative of a result of said comparing, the plurality of output signals including a first output signal and a second output signal;

compensating said plurality of output signals to reduce an offset between said plurality of output signals, wherein said compensating includes switching on a first transistor responsive to the first transistor detecting the first output signal and/or switching on a second transistor responsive to the second transistor detecting the second output signal;

providing a plurality of compensated output signals indicative of the result of said compensating, wherein said providing includes driving a first compensated output signal from the collector of the first transistor and/or driving a second compensated output signal from the collector of the second transistor, wherein the first compensated output signal and the second compensated output signal are produced independently of one another without combining the plurality of output signals;

filtering said plurality of compensated output signals;

providing a first control signal indicative of the result of said filtering; and providing said second input signal based on said first control signal.

12. The method of claim 11, wherein said filtering includes integrating one or more of said plurality of compensated control signals.

* * * * *